(12) United States Patent
Myers et al.

(10) Patent No.: US 10,885,953 B2
(45) Date of Patent: Jan. 5, 2021

(54) DATA BUFFER WITH TWO DIFFERENT OPERATING VOLTAGES FOR INPUT AND OUTPUT CIRCUITRY

(71) Applicant: ARM LIMITED, Cambridge (GB)

(72) Inventors: James Edward Myers, Bottisham (GB); David Walter Flynn, Cambridge (GB)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 15/764,437

(22) PCT Filed: Nov. 30, 2016

(86) PCT No.: PCT/GB2016/053749
§ 371 (c)(1),
(2) Date: Mar. 29, 2018

(87) PCT Pub. No.: WO2017/098211
PCT Pub. Date: Jun. 15, 2017

(65) Prior Publication Data
US 2019/0164582 A1 May 30, 2019

(30) Foreign Application Priority Data

Dec. 10, 2015 (GB) .................................. 1521797.9

(51) Int. Cl.
*G11C 7/10* (2006.01)
*G11C 16/30* (2006.01)
(Continued)

(52) U.S. Cl.
CPC ............ *G11C 7/1084* (2013.01); *G11C 5/147* (2013.01); *G11C 7/106* (2013.01); *G11C 7/1057* (2013.01);
(Continued)

(58) Field of Classification Search
CPC ... G11C 7/1084; G11C 7/1063; G11C 7/1057; G11C 11/4093; G11C 11/419; G11C 16/30
See application file for complete search history.

(56) References Cited

U.S. PATENT DOCUMENTS 6,351,404 B1 * 2/2002 Wright et al. ........... G11C 5/02
365/51
2002/0180483 A1 12/2002 Lim et al.
(Continued)

FOREIGN PATENT DOCUMENTS

GB 2 297 182 7/1996
GB 2 406 924 4/2005

OTHER PUBLICATIONS

International Search Report and Written Opinion of the ISA for PCT/GB2016/053749, dated Feb. 8, 2017, 11 pages.
(Continued)

*Primary Examiner* — Sultana Begum
(74) *Attorney, Agent, or Firm* — Nixon & Vanderhye P.C.

(57) ABSTRACT

A data buffer comprises data storage circuitry; input circuitry to input data to be stored by the data storage circuitry at a first operating voltage; output circuitry to output stored data from the data storage circuitry at a second operating voltage different to the first operating voltage; and control circuitry to control an operating voltage of the data storage circuitry to be substantially the first operating voltage during a data input operation by the input circuitry and to be substantially the second operating voltage during a data output operation by the output circuitry.

13 Claims, 6 Drawing Sheets

(51) Int. Cl.
*G11C 11/4093* (2006.01)
*G11C 11/419* (2006.01)
*G11C 5/14* (2006.01)
*G11C 11/4074* (2006.01)

(52) U.S. Cl.
CPC .......... *G11C 7/1063* (2013.01); *G11C 7/1087* (2013.01); *G11C 11/4074* (2013.01); *G11C 11/4093* (2013.01); *G11C 11/419* (2013.01); *G11C 16/30* (2013.01)

(56) References Cited

U.S. PATENT DOCUMENTS

| | | |
|---|---|---|
| 2003/0193084 A1 | 10/2003 | Shimizu et al. |
| 2004/0056355 A1* | 3/2004 | Minami .............. H01L 23/5286 257/758 |
| 2010/0238752 A1 | 9/2010 | Fujimoto |
| 2010/0260000 A1 | 10/2010 | Sridhara |
| 2012/0286850 A1 | 11/2012 | Myers et al. |
| 2013/0201765 A1 | 8/2013 | Cho et al. |
| 2013/0314149 A1* | 11/2013 | Cha et al. .............. H01H 85/04 327/525 |
| 2014/0313819 A1 | 10/2014 | Choi et al. |
| 2016/0329106 A1* | 11/2016 | Miwa ...................... G11C 16/32 |
| 2017/0125069 A1* | 5/2017 | Yoon ....................... G11C 5/147 |

OTHER PUBLICATIONS

Combined Search and Examination Report for GB 1521797.9 dated Feb. 26, 2016, 8 pages.
Office Action for TW Application No. 105140744 dated Aug. 31, 2020 and English translation, 12 pages.

\* cited by examiner

DATA BUFFER WITH TWO DIFFERENT OPERATING VOLTAGES FOR INPUT AND OUTPUT CIRCUITRY

This application is the U.S. national phase of International Application No. PCT/GB2016/053749 filed Nov. 30, 2016 which designated the U.S. and claims priority to GB Patent Application No. 1521797.9 filed Dec. 10, 2015, the entire contents of each of which are hereby incorporated by reference.

BACKGROUND

This disclosure relates to data buffers.

When passing data from one subsystem to another where the two subsystems are operating in different voltage domains (for example, sharing a ground rail but having different respective supply voltages), previously proposed arrangements use an asynchronous interface where the data is written synchronously to a data buffer in the source domain and is then read asynchronously in the sink domain. So-called level shifters are employed to convert output port logic levels to the voltage domain of the sink subsystem. Some handshaking is also used to control data transfer when the source or sink indicates that the buffer is full or empty.

However, where the voltage difference is more than about 200-300 mV (millivolts), level shifters can become large and slow compared to other circuitry elements.

One previous approach to mitigate this is to use fewer output ports, which is to say, fewer data connections to the sink domain which need level shifting. However, this can mean that more processing work is done in the lower voltage domain, which is generally inherently slower than the higher voltage domain.

It is a constant aim to improve the performance and/or fabrication size of circuitry such as data buffers.

SUMMARY

In an example arrangement there is provided a data buffer comprising:
data storage circuitry;
input circuitry to input data to be stored by the data storage circuitry at a first operating voltage;
output circuitry to output stored data from the data storage circuitry at a second operating voltage different to the first operating voltage; and
control circuitry to control an operating voltage of the data storage circuitry to be substantially the first operating voltage during a data input operation by the input circuitry and to be substantially the second operating voltage during a data output operation by the output circuitry.

In another example arrangement there is provided a data buffer comprising:
means for storing data;
input means for inputting data to be stored by the data storing means at a first operating voltage;
output means for outputting stored data from the data storing means at a second operating voltage different to the first operating voltage; and
control means for controlling an operating voltage of the data storing means to be substantially the first operating voltage during a data input operation by the input means and to be substantially the second operating voltage during a data output operation by the output means.

In another example arrangement there is provided a method of operation of a data buffer comprising:
inputting data to be stored at a first operating voltage;
storing the data in data storage circuitry;
outputting stored data at a second operating voltage different to the first operating voltage; and
controlling an operating voltage of the data storage circuitry to be substantially the first operating voltage during the inputting step and to be substantially the second operating voltage during the outputting step.

Further respective aspects and features of the present technology are defined by the appended claims.

BRIEF DESCRIPTION OF THE DRAWINGS

The present technique will be described further, by way of example only, with reference to embodiments thereof as illustrated in the accompanying drawings, in which.

DESCRIPTION OF EMBODIMENTS

Figure 1:
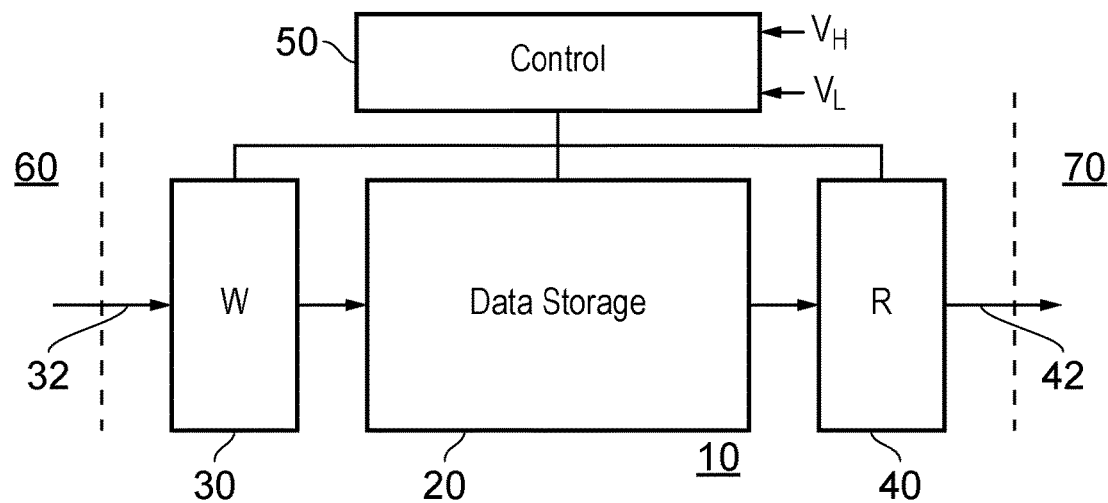
FIG. 1 schematically illustrates a data buffer.

Before discussing the embodiments with reference to the accompanying figures, the following description of embodiments is provided.

An example embodiment provides a data buffer comprising:
data storage circuitry;
input circuitry to input data to be stored by the data storage circuitry at a first operating voltage;
output circuitry to output stored data from the data storage circuitry at a second operating voltage different to the first operating voltage; and
control circuitry to control an operating voltage of the data storage circuitry to be substantially the first operating voltage during a data input operation by the input circuitry and to be substantially the second operating voltage during a data output operation by the output circuitry.

In example embodiments of the present disclosure, the operating voltage of the data storage circuitry of a data buffer is movable in operation, between a lower voltage applicable to a lower voltage domain (such as an input domain) and a higher voltage applicable to a higher voltage domain (such as an output domain). For example, the data buffer may be written to at the lower operating voltage, then the operating voltage is raised, then the buffer is read at the higher operating voltage. This can avoid the need for slow and large level shifters.

In examples, the control circuitry is configured to selectively provide one of an input enable signal indicating that the input circuitry is ready to input data and an output enable signal indicating that the output circuitry is ready to output data, and in examples the control circuitry is configured to generate a first voltage control signal to control the operating voltage of the buffer storage circuitry to be substantially the first operating voltage; and the control circuitry is configured to generate a second voltage control signal to control the operating voltage of the buffer storage circuitry to be substantially the second operating voltage. Conveniently, the enable signals can be related to the voltage control signals, so avoiding the need for some additional control logic (compared to a data buffer which would have used enable signals anyway), for example by the control circuitry comprising delay circuitry to delay the first voltage control signal to generate the input enable signal and to delay the second voltage control signal to generate the output enable signal.

In examples, the control circuitry is configured to generate the second voltage control signal in response to a detection of completion of a data input operation and/or the control circuitry is configured to generate the first voltage control signal in response to a detection of completion of a data output operation.

In some instances, reliable operation can be achieved even when the two voltage domains have different operating voltages, if they do not differ by very much. To allow for these circumstances, in examples the control circuitry is configured to inhibit changes to the operating voltage of the data storage circuitry in response to the first and second operating voltages differing by less than a threshold difference.

Although the change in operating voltage can be applied only to the data storage circuitry, in other examples it is also applied to the input and output circuitry. This can allow the data buffer to act as a self-contained unit with narrow input and output interfaces. In these examples, the control circuitry is configured to control an operating voltage of the input circuitry and the output circuitry to be substantially the first operating voltage during a data input operation by the input circuitry and to be substantially the second operating voltage during a data output operation by the output circuitry.

In examples, clamp circuitry can be provided to set a node of the input circuitry to a first predetermined voltage during a period when the input circuitry is not ready for data input operation and to set a node of the output circuitry to a second predetermined voltage during a period when the output circuitry is not ready for data output operation. This can avoid unexpected or incorrect input or output operations either during an operating voltage transition or when the input or output circuitry is operating according to the "other" domain's operating voltage. Clamp circuitry can also be configured to set the node of the input circuitry to the first predetermined voltage in response to a non-operational mode of external circuitry connected to the input circuitry, and to set the node of the output circuitry to the second predetermined voltage in response to a non-operational mode of external circuitry connected to the output circuitry.

In example embodiments the control circuitry comprises one or more power gating switches configured to selectively connect the data buffer to first or second power rails corresponding to the first and second operating voltages respectively, the one or more power gating switches being configured to connect the data buffer to no more than one of the first and second power rails at any time.

In some examples, multiple (for example, dual) buffer arrangements may be used. For example, the data buffer may comprise second data storage circuitry; second input circuitry to input data to be stored by the second data storage circuitry; and second output circuitry to output stored data from the second data storage circuitry.

In some examples, the second data storage circuitry buffers data in the other direction to the first-mentioned data storage circuitry, in which the second input circuitry is configured to input data at the second operating voltage; the second output circuitry is configured to output data at the first operating voltage; and the control circuitry is configured to control an operating voltage of the second data storage circuitry to be substantially the first operating voltage during a data output operation by the second output circuitry and to be substantially the second operating voltage during a data input operation by the second input circuitry.

In other examples, the second data storage circuitry may buffer data in the same direction as the first-mentioned data storage circuitry, but offering the opportunity (for example) to input data while the other data storage circuitry is outputting, and to output while the other data storage circuitry is inputting. In such examples the second input circuitry is configured to input data at the first operating voltage; the second output circuitry is configured to output data at the second operating voltage; and the control circuitry is configured to control an operating voltage of the second data storage circuitry to be substantially the second operating voltage during a data output operation by the second output circuitry and to be substantially the first operating voltage during a data input operation by the second input circuitry. In these examples, the control circuitry is configured to control the operating voltages of the first-mentioned data storage circuitry and the second data storage circuitry so that when one of the first-mentioned data storage circuitry and the second data storage circuitry is operating according to the first operating voltage, the other of the first-mentioned data storage circuitry and the second data storage circuitry is operating according to the second operating voltage.

In these dual buffer arrangements, it is possible to use the (currently) higher voltage data storage circuitry to contribute to raising the voltage of the lower voltage data storage circuitry, and the lower voltage data storage circuitry to contribute to lowering the voltage of the higher voltage data storage circuitry, without necessarily needing externally applied power (at least in respect of the contribution made), by the control circuitry being configured to selectively connect power supply inputs of the first-mentioned data storage circuitry and the second data storage circuitry together in response to initiation of a change of operating voltage of the first-mentioned data storage circuitry and the second data storage circuitry.

In examples, this can be achieved by the control circuitry comprising:

one or more power gating switches configured to selectively connect the power supply inputs of the first-mentioned data buffer and the second data buffer to first or second power rails corresponding to the first and second operating voltages respectively, and an interconnection switch configured to connect the power supply inputs of the first-mentioned data buffer and the second data buffer together;

the control circuitry being configured, in response to initiation of a change in the operating voltages of the first-mentioned and second data storage circuitry, to control the interconnection switch to temporarily connect the power supply inputs of the first-mentioned data buffer and the second data buffer together, and then to control the one or more power gating switches to connect the power supply inputs of the first-mentioned data storage circuitry and the second data storage circuitry to respective ones of the first and second power rails.

In another example of a multiple data storage circuitry arrangement, a data buffer has second data storage circuitry;

second input circuitry to input data to be stored by the second data storage circuitry at the higher of the first and second operating voltages; and second output circuitry to output stored data from the second data storage circuitry at the higher of the first and second operating voltages. This arrangement notes that in at least some instances, the voltage change mechanism discussed above may be appropriate for steps up in voltage but not for steps down in voltage (where the lower voltage domain circuitry may operate correctly with higher voltage domain signals). In these instances, a step-down buffer arrangement is provided which does not use changes in operating voltage of the data storage. This can avoid delays associated with the voltage changing operation.

In other examples, the data buffer can be bidirectional, by comprising:

second input circuitry to input data to be stored by the data storage circuitry at the second operating voltage; and second output circuitry to output stored data from the data storage circuitry at the first operating voltage;

in which the control circuitry is configured to control the operating voltage of the data storage circuitry to be substantially the first operating voltage during a data input operation by the first-mentioned input circuitry or a data output operation by the second output circuitry, and to be substantially the second operating voltage during a data output operation by the first-mentioned output circuitry or a data input operation by the second input circuitry.

Referring now to the drawings, FIG. 1 schematically illustrates a data buffer 10 comprising data storage circuitry 20 such as an array of flip-flop gates or an array of SRAM-based storage elements with associated read/write circuitry; input circuitry 30 to receive input data 32 and write the input data into the data storage 20; output circuitry 40 to retrieve data stored in the data storage 20 and provide it as output data 42; and control circuitry 50.

The data buffer 10 is provided for data communication between circuitry in a first voltage domain 60, for example a lower voltage domain (such as a voltage domain containing circuitry at an operating voltage of 300 mV) and a second voltage domain 70 such as a higher voltage domain (for example containing circuitry operating at an operating voltage of 1V). More generally, either the operating voltage of the voltage domain 60 or the operating voltage of the voltage domain 70 can be the higher of the two operating voltages, although in the examples to be discussed, the (output) operating voltage, which is to say the operating voltage of the voltage domain 70, is taken to be the higher voltage for the purposes of the present description. The higher of the two operating voltages is referred to as $V_H$ and the lower of the two operating voltages is referred to as $V_L$.

The input circuitry 30 inputs data to be stored by the data storage circuitry 20 at a first operating voltage, which in this example is $V_L$. The output circuitry 40 outputs data from the data storage circuitry 20 at the second operating voltage different to the first operating voltage—in this example, the operating voltage $V_H$. The two voltage domains 60, 70 may share a common ground level or rail.

The control circuitry 50 is arranged to control an operating voltage of the data storage circuitry 20 so that the operating voltage of the data storage circuitry 20 is the same as that of the voltage domain 60 (or at least is a first voltage suitable for use with circuitry of the voltage domain 60) during a data input operation by the input circuitry 30 and is the same as the voltage of the voltage domain 70 (or at least is a second voltage different to the first operating voltage which is compatible with that of the voltage domain 70) during data output operations by the output circuitry 40. In a specific example, the voltage domain 60 operates at the operating voltage $V_L$ and, during a data input operation, the data storage circuitry is controlled to operate at the operating voltage $V_L$. Again, in this example, the voltage domain 70 operates at an operating voltage $V_H$ and during a data output operation the data storage circuitry 20 is controlled by the control circuitry 50 to operate at an operating voltage of $V_H$. Therefore, in examples, the control circuitry 50 controls an operating voltage of the data storage circuitry 20 to be substantially the first operating voltage during a data input operation by the input circuitry and to be substantially the second operating voltage during a data output operation by the output circuitry.

In a practical implementation, even where the data storage circuitry is connected to either a power rail at $V_H$ or a power rail at $V_L$, the operating voltage of the data storage circuitry might differ slightly from the operating voltage of other circuitry (such as circuitry external to the data storage circuitry) connected to that same power rail, for example because of so-called parasitic resistance and/or capacitance effects. The term "substantially" is used here to indicate that the operating voltage of the data storage circuitry is at least nominally the same as $V_H$ or $V_L$, or is sufficiently close to a nominal voltage of $V_H$ or $V_L$ (for example, differing from $V_H$ or $V_L$ for one of the reasons discussed above) so that the data storage circuitry can interact appropriately with the external circuitry operating at $V_H$ or $V_L$. In examples, the same power rails are used as those providing $V_H$ or $V_L$ to the external circuitry, so that any deviations from $V_H$ or $V_L$ are just caused by normal circuit effects of the types discussed above, but this is not a requirement.

During a data input operation, the data output circuitry 40 is not in use. Similarly, during a data output operation, the data input circuitry 30 is not in use. In example embodiments, the operating voltage of the data output circuitry 40 and the data input circuitry 30 is also varied by the control circuitry in the same way as the variation of the operating voltage of the data storage circuitry 20, which is to say that it is adjusted to the operating voltage $V_L$ during a data input operation and to the operating voltage $V_H$ during a data output operation. This arrangement allows the data buffer 10 to be a self-contained arrangement and avoids at least some need for level-shifting circuitry. In this example the control circuitry is configured to control an operating voltage of the input circuitry and the output circuitry to be substantially the first operating voltage during a data input operation by the input circuitry and to be substantially the second operating voltage during a data output operation by the output circuitry.

However, it would be possible for the data input circuitry 30 always to operate at $V_L$ and for the data output circuitry 40 always to operate at $V_H$.

Figure 2:
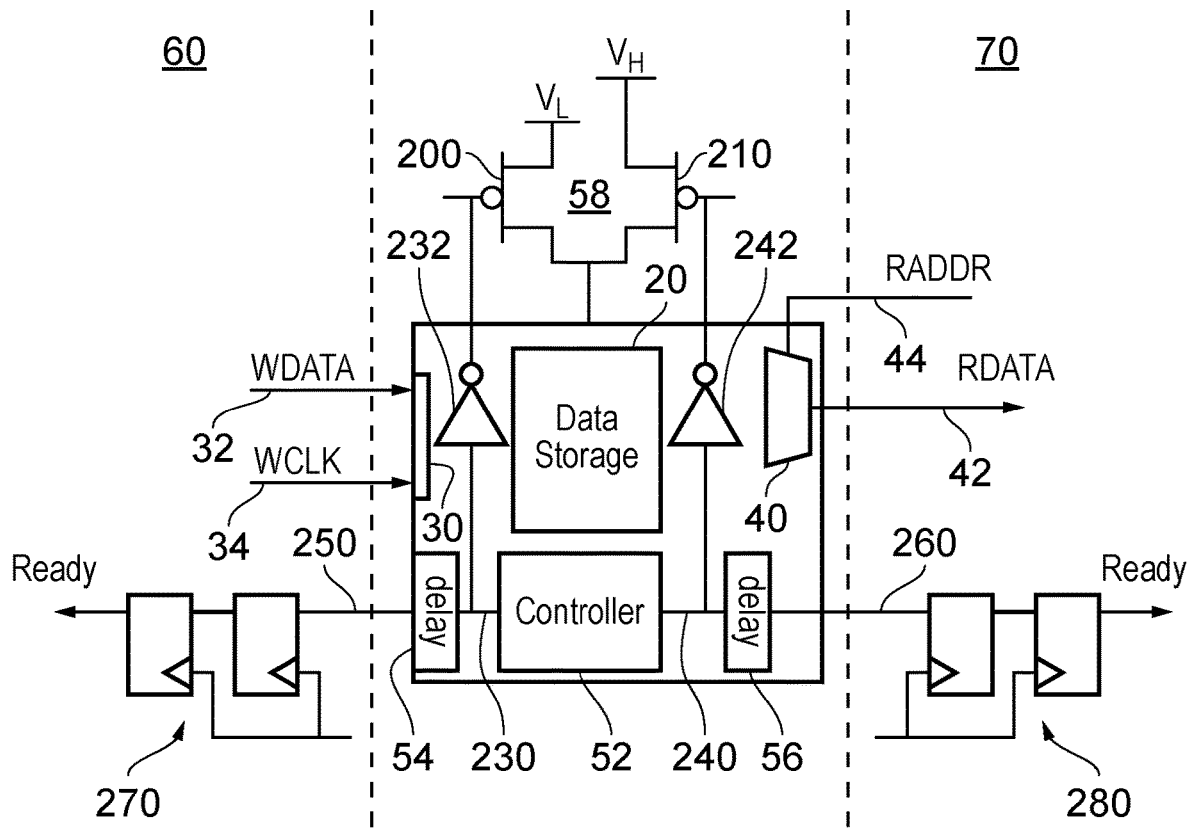
FIG. 2 schematically illustrates the data buffer of FIG. 1 in more detail.

FIG. 2 schematically illustrates the arrangement of FIG. 1 in more detail. In FIG. 2, the control circuitry 50 includes a controller 52, delays 54, 56 and a power gating arrangement 58. Input data is written to the data storage under the control of a write clock signal 34. Output data is read from the data storage in accordance with a read address indication 44.

Figure 3:
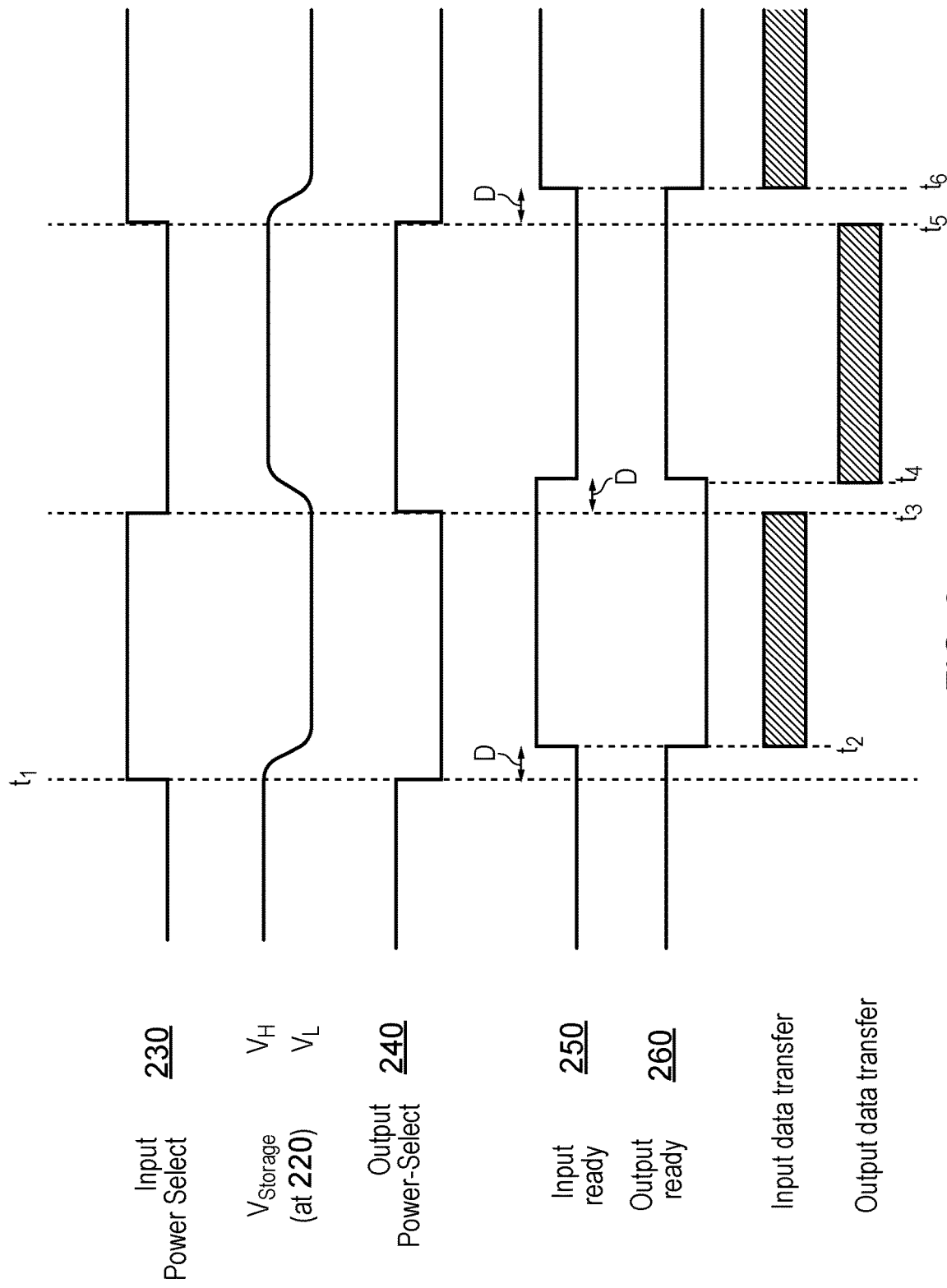
FIG. 3 is a schematic timing diagram.

The power gating circuitry 58 comprises a pair of transistor switches 200, 210 connected to power rails at $V_L$ and $V_H$ respectively. At any instant in time either the switch 200 or the switch 210, but not both, is "on" or enabled. This provides a mutually exclusive, break-before-make, power switch arrangement for supplying power to a power supply input 220 of the data buffer 10. The way in which this arrangement operates will be described with respect to an example data transfer operation. Reference will also be made to FIG. 3 which is a schematic timing diagram relating to this operation.

The transistors 200, 210 provide an example of the control circuitry 50 comprising one or more power gating switches configured to selectively connect the data buffer to first or second power rails corresponding to the first and second operating voltages respectively, the one or more power gating switches being configured to connect the data buffer to no more than one of the first and second power rails at any time.

The data buffer 10 operates to transfer data uni-directionally from the low voltage domain (in this example) to the high voltage domain. A first stage of operation is initiation of the writing of data into the data storage 20 so that it can be subsequently read out from the data storage 20 and transferred as output data 42 to circuitry in the higher voltage domain 70.

The controller 50 asserts a power selection signal 230 and de-asserts a power selection signal 240. These are passed via respective inverters 232, 242 to the transistors 200, 210. They cause the transistor 200 to be turned on and the transistor 210 to be turned off. The state of the signals 230, 240 are shown as the first and third lines in FIG. 3, with the signal 230 asserted and the signal 240 deasserted at a time $t_1$.

FIG. 3 shows examples of successive input, output and input data transfers. A transfer immediately preceding the time $t_1$ is not shown in the drawing, just for clarity of the diagram, but it should be assumed that an output data transfer has just completed at the time $t_1$. This explains the need to change the operating voltage to $V_L$ at $t_1$; if no input or output activity is taking place and a next expected operation is an input data transfer, the operating voltage is maintained at $V_L$.

Note that although the signals 230, 240 are shown as being carried by separate signal lines in the diagram, this is of course just one way of communicating multiple signals (a signal to select one power rail and a signal to select another power rail). The two selections could instead be communicated by a single signal line or group of signal lines carrying two different signal values, for example to different analogue levels or two different digitally encoded values. Note also that turning on and off two different transistors associated with different voltage rails is of course just one way of selecting a supply voltage for the data storage 20. A single signal-controllable power supply could be used, for example.

There is a non-zero delay before the voltage at the power supply input 220 (shown by the second line of FIG. 3) adjusts to its new value. The delay is caused by inherent capacitance of the circuitry (such as the data storage circuitry 20) being supplied with power by the power supply input 220. Again, this delay is illustrated schematically in the second line of FIG. 3. If data transfer were to be allowed during this transitional voltage period, uncertain results may occur. This is particularly a problem at the output side, where if data transfer is attempted while the supply voltage at the terminal 220 is too low for compatibility with circuitry of the higher voltage domain 70, the output data may not reach a sufficient voltage to be detected correctly by circuitry in the higher voltage domain 70. Similar issues can occur at the input side of FIG. 2. Therefore, the delay 54 is provided to delay the power selection signal 230 such that the delayed version of the power selection signal 230 forms an "input ready" signal 250. Similarly, the delay 56 applies a time delay to the power selection signal 240 (which, when asserted, causes the transistor 210 to be turned on so as to select the $V_H$ power rail) so as to form an "output ready" signal 260. It is the signals 250, 260 which are provided, optionally via synchronisers 270, 280, to the external circuitry in the low voltage domain 60 or the high voltage domain 70 respectively to initiate data transfer. A schematic example of the input ready signal 250 and the output ready signal 260 are shown in FIG. 3, with a delay period D—corresponding to the delay of the elements 54, 56—being shown relative to the time $t_1$. Input data transfer (a sixth line of FIG. 3) then takes place starting from a time no earlier than the assertion of the input ready signal 250. In FIG. 3 this is no earlier than a time $t_2$. The controller 52 detects the end of an input data transfer, which in this example is at a time $t_3$. In response to the detection of the completion of the input data transfer, the controller 52 de-asserts the input power select signal and asserts the output power select signal 240. In this way, the control circuitry is configured to generate the second voltage control signal 240 in response to a detection of completion of a data input operation. Similarly, as discussed below with respect to FIGS. 4, 5A and 5B, the control circuitry can be configured to generate the first voltage control signal 230 in response to a detection of completion of a data output operation.

After a delay period D the output ready signal 260 is asserted and, at any time from a time $t_4$ an output data transfer can take place (seventh line of FIG. 3), and so on. The output data transfer terminates at a time $t_5$ and the process continues to a next input data transfer starting at a time $t_6$, and so on.

Therefore, in examples, the control circuitry 50 is configured to selectively provide one of an input enable signal 250 indicating that the input circuitry is ready to input data and an output enable signal 260 indicating that the output circuitry is ready to output data. The control circuitry is configured to generate a first voltage control signal 230 to control the operating voltage of the buffer storage circuitry to be substantially the first operating voltage, and the control circuitry is configured to generate a second voltage control signal 240 to control the operating voltage of the buffer storage circuitry to be substantially the second operating voltage. The control circuitry comprises delay circuitry 54, 56 to delay the first voltage control signal 230 to generate the input enable signal 250 and to delay the second voltage control signal 240 to generate the output enable signal 260.

Techniques for detecting the end of an input data transfer will now be discussed, by way of example, with reference to FIGS. 4, 5A and 5B.

Figure 4:
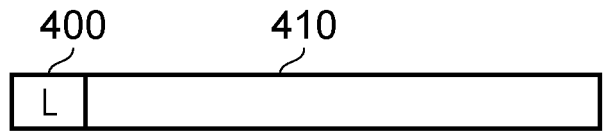
FIGS. 4, 5A and 5B schematically illustrate techniques for detecting the end of an input data transfer.

In FIG. 4, input data 32 comprises a header or initial portion 400 followed by data 410 to be written to the data storage 20. The header 400 may or may not be written into the data storage as well, or may just be held temporarily by the control circuitry 50. The header 400 provides an indication of the length L, such as the number of data bytes, of the data 410. For example, the header 400 can provide a numerical value such as "8", indicating that 8 bytes of data 410 follow. The control circuitry 50 may comprise, for example, a counter 500 (FIG. 5A) associated with a detector 510, such that the counter 500 counts the number of bytes of data received as the data 410 and the detector 510 compares that number with the expected length L (400) so as to detect when all of the expected bytes of data have been received. At this point, the control circuitry can operate as discussed above with reference to the time $t_3$ and detect the end of the input data transfer. Similarly, at output, the control circuitry 50 can count the number of data bytes which have been output (or simply act in order to empty the data storage 20 of stored data) to detect the end of an output data transfer.

Figures 5A, 5B:
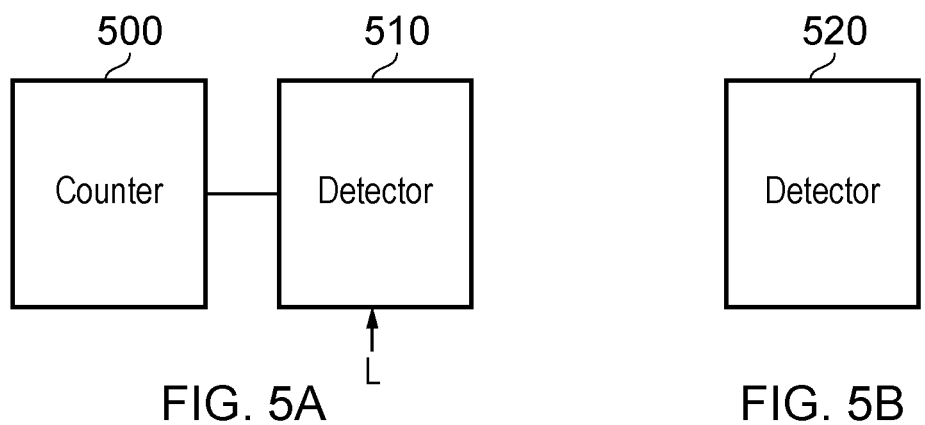

Another possible arrangement is illustrated in FIG. 5B in which a detector 520 forming part of the control circuitry 50 detects an "end of transfer" code or footer associated with data being written into the data storage 20 during a data input operation. In response to detection of the footer, which may be a predetermined data value or pattern of data values, the detector 520 detects the end of an input data transfer and initiates actions associated with the time $t_3$ in FIG. 3.

Figure 6:
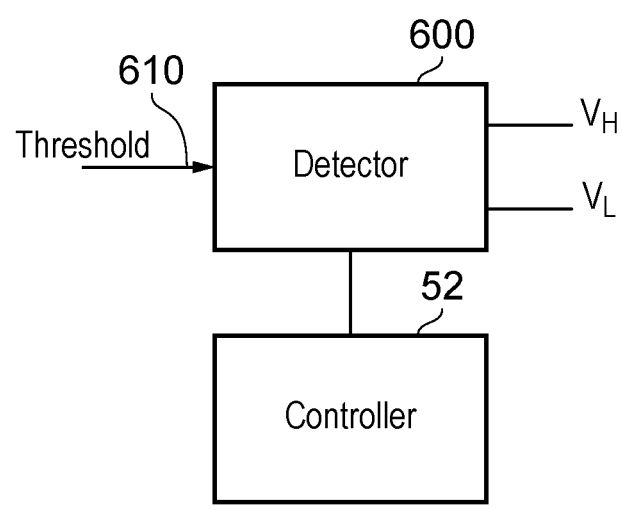
FIG. 6 schematically illustrates a voltage detector.

The discussion of FIG. 3 noted that a change in operating voltage of the data storage circuitry 20 involved a short but non-zero time delay D, for example 100 µs. In some instances, a change in voltage is not required, for example if the first and second operating voltages differ by less than a threshold difference such as a threshold difference of 100 mV. FIG. 6 schematically illustrates a detector 600 configured to detect whether the voltages $V_H$ and $V_L$ differ by less than the threshold difference 610. If so, the controller 52 does not change the voltage between read and write operations. This provides an example of the control circuitry 50 being configured to inhibit changes to the operating voltage of the data storage circuitry in response to the first and second operating voltages differing by less than a threshold difference 610.

Clamp circuitry may be used in order to avoid unexpected data handling results at the input and output and also to avoid possible damage at the lower voltage side when circuitry of the data buffer is operating at the higher voltage. The clamp circuitry can set a node of the input circuitry to a first pre-determined voltage (such as a ground voltage or 0V which, as mentioned above, can be a common ground across the whole circuitry) when the input circuitry is not ready for input (for example, when the "input ready" signal is not asserted, such as during a period when the output circuitry is ready for data output operation and during periods in which the data buffer is transitioning between operating voltages) and can set a node of the output circuitry to a second pre-determined voltage (which may be the same as the first pre-determined voltage) when the output circuitry is not ready for output (for example, when the "output ready" signal is not asserted, such as during a period when the input circuitry is ready for data input operation and during periods in which the data buffer is transitioning between operating voltages).

Figure 7:
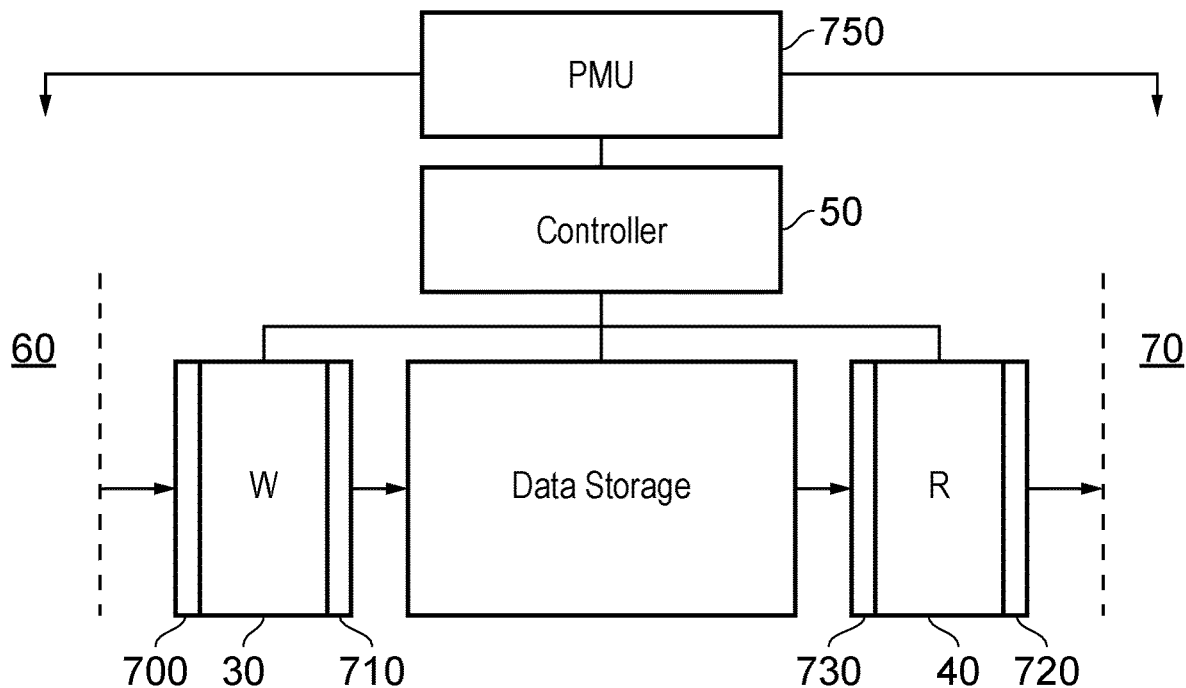
FIG. 7 schematically illustrates clamp circuitry.

An example of such an arrangement is shown schematically in FIG. 7. Clamp circuitry 700 can be implemented at the input of the input circuitry 30 or at the output (as clamp circuitry 710) of the input circuitry. Similarly, at the output side, clamp circuitry 720 may be implemented at the output of the output circuitry 40 or clamp circuitry 730 may be implemented at the input side of the output circuitry 40. Accordingly, examples of "nodes" of the type mentioned above are: the input or the output of the input circuitry 30; and the input or the output (and/or a read address input) of the output circuitry 40. This therefore provides an example of the use of clamp circuitry to set a node of the input circuitry to a first predetermined voltage when not ready for input (during at least a data output operation by the output circuitry) and to set a node of the output circuitry to a second predetermined voltage when not ready for output (during at least a data input operation by the input circuitry) as discussed above. As discussed, the clamp circuitry may also be configured to set the node of the input circuitry to the first predetermined voltage in response to a non-operational mode of external circuitry connected to the input circuitry, and to set the node of the output circuitry to the second predetermined voltage in response to a non-operational mode of external circuitry connected to the output circuitry.

The clamp circuitry can be activated so as to clamp the node to which it relates to a pre-determined voltage, in response to the other one of the input and output circuitry being active. In other examples, the clamp circuitry can be activated in response to external circuitry being placed into a shut down or sleep mode, for example by having its own power supply gated to be off. For example, if circuitry in the voltage domain 60 is placed into a shut down or sleep mode of this type, then the clamp circuitry 700 or 710 may be activated, for example under the control of a power management unit 750. (The power management unit 750 controls power management of the entire apparatus including circuitry external to the data buffer in the voltage domain 60 and/or the voltage domain 70.) Similarly, if circuitry in the voltage domain 70 is placed into a shut down or sleep mode then the clamp circuitry 730 or 720 can be activated, again under the overall control of the power management unit 750.

Figures 8, 9:
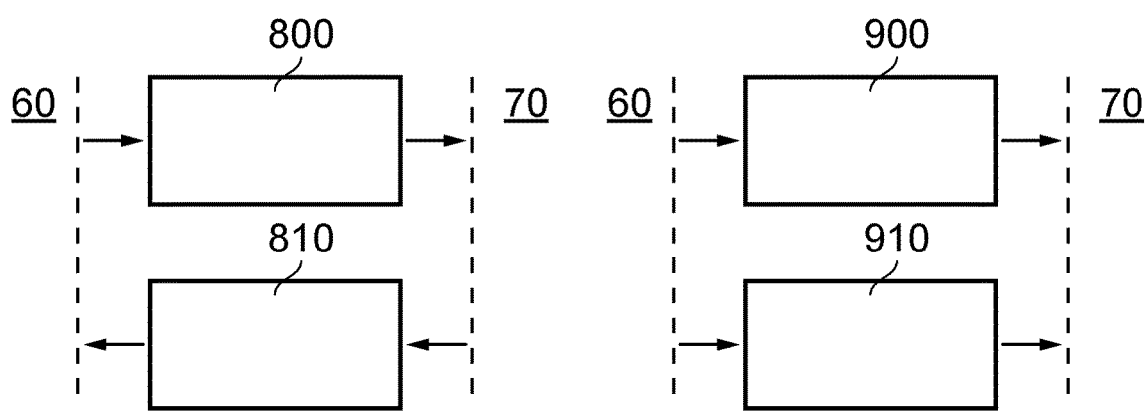
FIGS. 8 and 9 schematically illustrate other example configurations of a data buffer.

FIGS. 8 and 9 schematically illustrate example configurations for multiple data storage circuitries 20 similar to that shown in FIG. 1. The detail of FIG. 1 is not shown in FIG. 8, so that the general principles may be discussed.

In FIG. 8, the data buffer comprises two data storage circuitries and associated read and write circuitry but operating in opposite directions so that a first data storage circuitry 800 and associated control, read and write circuitry acts to transfer data from the voltage domain 60 to the voltage domain 70 and a second data storage circuitry 810 and associated control, read and write circuitry operates to transfer data from the voltage domain 70. The control circuitry may be shared or at least partly in common between the two. In FIG. 9, two data storage circuitries 900, 910 are provided with associated control, read and write circuitry so as to provide data transfer from the voltage domain 60 to the voltage domain 70 in each case, but can be arranged so that when one of the data storage circuitries 900, 910 is in a write or input data transfer mode, the other one of the data storage circuitries 900, 910 is in a data output or read mode. This co-ordination is carried out by the control circuitry 50 which can be common to both of the circuitries 900, 910.

FIGS. 8 and 9 therefore both provide examples of a data buffer comprising second data storage circuitry, second input circuitry to input data to be stored by the second data storage circuitry, and second output circuitry to output stored data from the second data storage circuitry.

In the example of FIG. 8, the second input circuitry is configured to input data at the second operating voltage, the second output circuitry is configured to output data at the first operating voltage and the control circuitry is configured to control an operating voltage of the second data storage circuitry to be substantially the first operating voltage during a data output operation by the second output circuitry and to be substantially the second operating voltage during a data input operation by the second input circuitry.

In the example of FIG. 9, the second input circuitry is configured to input data at the first operating voltage, the second output circuitry is configured to output data at the second operating voltage and the control circuitry is configured to control an operating voltage of the second data storage circuitry to be substantially the second operating voltage during a data output operation by the second output circuitry and to be substantially the first operating voltage during a data input operation by the second input circuitry.

Figure 10:
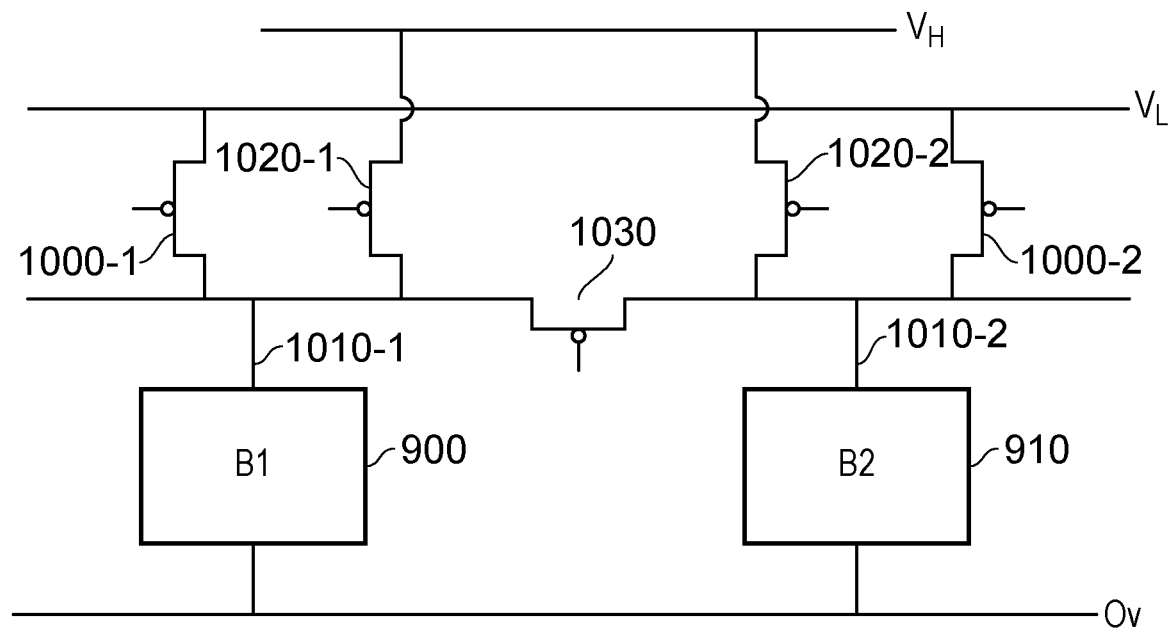
FIG. 10 schematically illustrates switching circuitry.

FIG. 10 schematically illustrates aspects of the controller 50 with relevance to the arrangements of FIGS. 8 and 9. The particular arrangement being discussed here is one in which one of the data storage circuitries is in communication with the voltage domain 60 and the other of the data storage circuitries is in communication with the voltage domain 70. This implies that one of the data storage circuitries is operating at the operating voltage $V_H$ and the other data storage circuitry is operating at the operating voltage $V_L$.

In FIG. 10, each of the two circuitries (labelled as B1 and B2 for a first data buffer and a second data buffer) has a respective transistor 1000-1, 1000-2 connecting its respective power supply input 1010-1, 1010-2 to $V_L$ and a respective transistor 1020-1, 1020-2 connecting its power supply input to the power rail $V_H$. A further transistor switch 1030 is provided connecting the two power supply inputs 1010-1, 1010-2 of the respective circuitries.

Assume for the sake of example that the circuitry 900 (B1) is currently operating at $V_H$ and the circuitry 910 (B2) is currently operating at $V_L$. Assume that a change (an inversion of this operating voltage relationship) has been initiated by the control circuitry 50.

Figure 11:
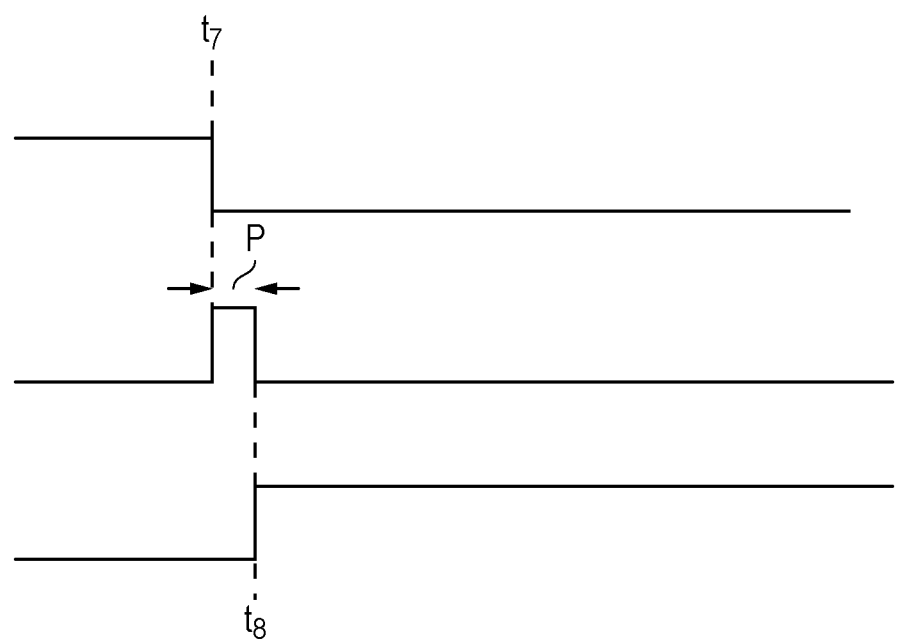
FIG. 11 is a schematic timing diagram.

Referring also to FIG. 11, at a time $t_7$, the transistor 1020-1 associated with the circuitry 900 (B1) is turned off and the transistor 1000-2 associated with the circuitry 910 (B2) is also turned off. This isolates both circuitries from either power rail. The transistor 1030 is turned on for a period P. The inherent capacitance of the two circuitries 900, 910 means that the power supply terminals 1010-1, 1010-2 of each circuitry do not instantaneously fall to 0V but instead tend to equalise by being connected together by the transistor 1030. This brings up voltage at the power supply terminal 1010-2 of the circuitry 910 and brings down the voltage at the terminal 1010-1 of the circuitry 900 without the need for any energy provided by a power supply. After the period P, at a time $t_8$, the transistor 1030 is turned off and the respective transistors linking the circuitries 900, 910 to their appropriate power rails are switched on, so that the transistor 1000-1 for the circuitry 900 is switched on and the transistor 1020-2 for the circuitry 910 is switched on.

This therefore provides an example in which the control circuitry 50 is configured to control the operating voltages of the first-mentioned data storage circuitry (800, 900) and the second data storage circuitry (810, 910) so that when one of the first-mentioned data storage circuitry and the second data storage circuitry is operating according to the first operating voltage (such as $V_L$), the other of the first-mentioned data storage circuitry and the second data storage circuitry is operating according to the second operating voltage (such as $V_H$).

In examples, the control circuitry 50 is configured to selectively connect power supply inputs of the first-mentioned data storage circuitry and the second data storage circuitry together in response to initiation of a change of operating voltage of the first-mentioned data storage circuitry and the second data storage circuitry. This can be achieved in example arrangements by the control circuitry comprising one or more power gating switches 1000-1/2 and 1020-1/2 configured to selectively connect the power supply inputs 1010-1/2 of the first-mentioned data buffer and the second data buffer to first or second power rails corresponding to the first and second operating voltages respectively, and an interconnection switch 1030 configured to connect the power supply inputs of the first-mentioned data buffer and the second data buffer together, the control circuitry being configured, in response to initiation of a change in the operating voltages of the first-mentioned and second data storage circuitry, to control the interconnection switch to temporarily connect the power supply inputs of the first-mentioned data buffer and the second data buffer together (for example, for the period P), and then to control the one or more power gating switches to connect the power supply inputs of the first-mentioned data storage circuitry and the second data storage circuitry to respective ones of the first and second power rails.

The period P can be a predetermined period or can be based upon a detection (by a detector, not shown) that the two power supply terminals 1010-1/2 have arrived at the same voltage, or at least have arrived at voltages within a threshold difference of one another (such as a threshold of 20 mV).

The general arrangement of FIG. 8 can also be implemented in a different manner to that just described. For example, the data buffer can comprise second data storage circuitry 810 but in this case having second input circuitry to input data to be stored by the second data storage circuitry at the higher of the first and second operating voltages an second output circuitry to output stored data from the second data storage circuitry at the higher of the first and second operating voltages. In this way, the arrangements discussed above for changing the voltage of the data storage circuitry are used for data transfers, via the data buffer, from the lower voltage domain to the higher voltage domain (to improve reliability of data transfer in that direction, by avoiding reading data at too low a voltage to be correctly recognised at the higher voltage domain output) but in the other (high to low) direction, no voltage changing is employed. This is on the assumption that higher operating voltage data can be successfully detected and processed by lower voltage domain circuitry.

Figure 12:
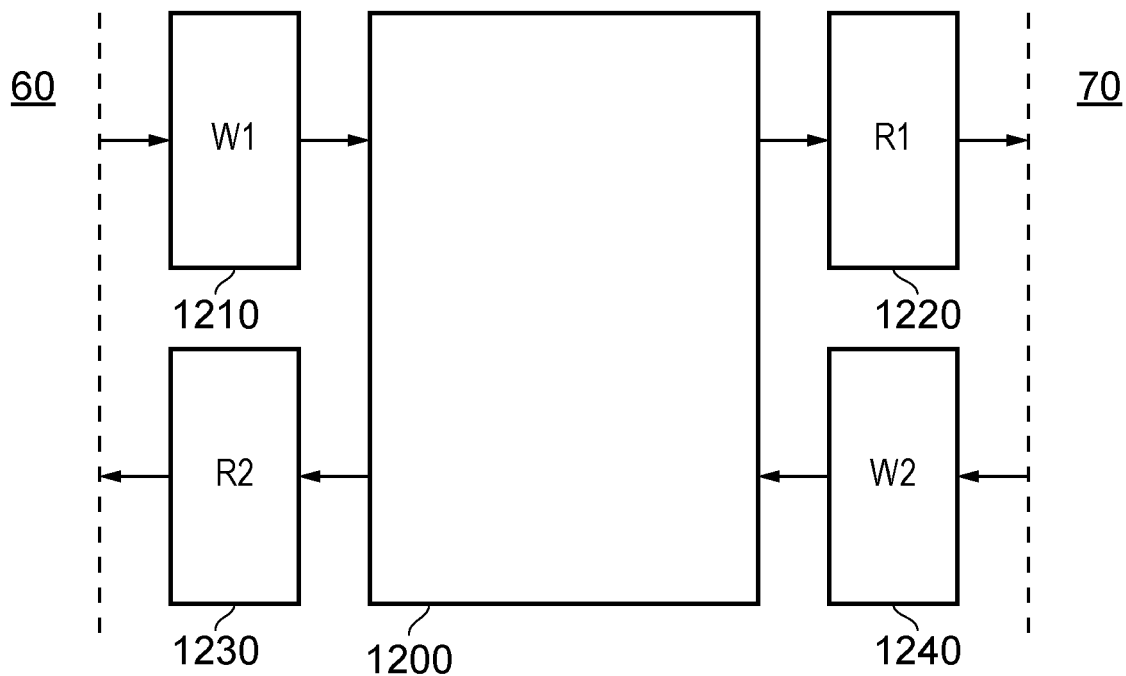
FIG. 12 schematically illustrates another example configuration of a data buffer.

FIG. 12 schematically illustrates another arrangement in which a data storage circuitry 1200 can be written to bi-directionally and read from bi-directionally, which is to say data can be written into the data storage circuitry 1200 from the voltage domain 60 via a first write circuitry 1210 and read from the data storage circuitry 1200 to the voltage domain 70 via a first read circuitry 1220. Also, data can be written to the data storage circuitry 1200 from the voltage domain 70 by a second write circuitry 1240 and read from the data storage circuitry 1200 to the voltage domain 60 by a second read circuitry 1230. Control circuitry (not shown in FIG. 12 for clarity of the diagram) controls the operation of the data storage circuitry and the read and write circuitries so that communication takes place at any point in time with only one of the two voltage domains 60, 70, and during such communication the data storage circuitry operates at an operating voltage appropriate to the currently communicating voltage domain. In some examples, either data input or data output (but not both) takes place at any one instance in time. FIG. 12 therefore provides an example of a data buffer comprising second input circuitry 1240 to input data to be stored by the data storage circuitry at the second operating voltage; and second output circuitry 1230 to output stored data from the data storage circuitry at the first operating voltage; in which the control circuitry is configured to control the operating voltage of the data storage circuitry to be substantially the first operating voltage during a data input operation by the first-mentioned input circuitry or a data output operation by the second output circuitry, and to be substantially the second operating voltage during a data output operation by the first-mentioned output circuitry or a data input operation by the second input circuitry.

Note that in all of these discussions, the term "second" refers simply to the order of description rather than any order of importance of precedence.

Figure 13:
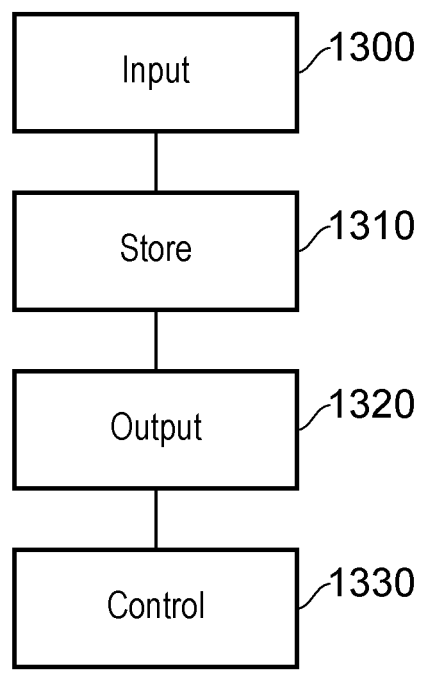
FIG. 13 is a schematic flowchart illustrating a method of operation of a data buffer.

FIG. 13 is a schematic flowchart illustrating a method of operation of a data buffer comprising:

inputting (at a step 1300) data to be stored at a first operating voltage;

storing (at a step 1310) the data in data storage circuitry;

outputting (at a step 1320) stored data at a second operating voltage different to the first operating voltage; and controlling (at a step 1330) an operating voltage of the data storage circuitry to be substantially the first operating voltage during the inputting step and to be substantially the second operating voltage during the outputting step.

In the present application, the words "configured to . . ." are used to mean that an element of an apparatus has a configuration able to carry out the defined operation. In this context, a "configuration" means an arrangement or manner of interconnection of hardware or software. For example, the apparatus may have dedicated hardware which provides the defined operation, or a processor or other processing device may be programmed to perform the function, in which case software or program instructions by which the function is performed, and a providing medium such as a non-transitory machine-readable medium by which such software or program instructions are provided (for example, stored) are considered to represent embodiments of the disclosure. "Configured to" does not imply that the apparatus element needs to be changed in any way in order to provide the defined operation.

Although illustrative embodiments of the present techniques have been described in detail herein with reference to the accompanying drawings, it is to be understood that the present techniques are not limited to those precise embodiments, and that various changes, additions and modifications can be effected therein by one skilled in the art without departing from the scope and spirit of the techniques as defined by the appended claims. For example, various combinations of the features of the dependent claims could be made with the features of the independent claims without departing from the scope of the present techniques.

The invention claimed is:

1. A data buffer comprising:
first data storage circuitry;
first input circuitry, in a first voltage domain, to input data to be stored by the first data storage circuitry at a first operating voltage;
first output circuitry, in a second voltage domain different from the first voltage domain, to output stored data from the first data storage circuitry at a second operating voltage different from the first operating voltage;
control circuitry to control an operating voltage of the first data storage circuitry to be substantially the first operating voltage during a data input operation by the first input circuitry and to be substantially the second operating voltage during a data output operation by the first output circuitry;
second data storage circuitry;
second input circuitry to input data to be stored by the second data storage circuitry; and
second output circuitry to output stored data from the second data storage circuitry,
wherein:
the second input circuitry is configured to input data at substantially the second operating voltage;
the second output circuitry is configured to output data at substantially the first operating voltage;
the control circuitry is configured to:
control an operating voltage of the second data storage circuitry to be the substantially the first operating voltage during a data output operation by the second output circuitry and to be substantially the second operating voltage during a data input operation by the second input circuitry;
control the operating voltages of the first data storage circuitry and the second data storage circuitry so that when one of the first data storage circuitry and the second data storage circuitry is operating according to the first operating voltage, the other of the first data storage circuitry and the second data storage circuitry is operating according to the second operating voltage;
selectively connect power supply inputs of the first data storage circuitry and the second data storage circuitry together in response to initiation of a change of operating voltage of the data storage circuitry and the second data storage circuitry;
the control circuitry comprises one or more power gating switches to selectively connect the power supply inputs of the first data storage circuitry and the second data storage circuitry to first or second power rails corresponding to the first and second operating voltages respectively, and an interconnection switch configured to connect the power supply inputs of the first data storage circuitry and the second data storage circuitry together;
the control circuitry is configured, in response to initiation of a change in the operating voltages of the first data storage circuitry and the second data storage circuitry, to control the interconnection switch to temporarily connect the power supply inputs of the first data storage circuitry and the second data storage circuitry together, and then to control the one or more power gating switches to connect the power supply inputs of the first data storage circuitry and the second data storage circuitry to respective ones of the first and second power rails.

2. A data buffer according to claim 1, in which the control circuitry is configured to selectively provide one of an input enable signal indicating that the first input circuitry is ready to input data and an output enable signal indicating that the first output circuitry is ready to output data.

3. A data buffer according to claim 2, in which:
the control circuitry is configured to generate a first voltage control signal to control the operating voltage of the first data storage circuitry to be substantially the first operating voltage; and
the control circuitry is configured to generate a second voltage control signal to control the operating voltage of the first data storage circuitry to be substantially the second operating voltage.

4. A data buffer according to claim 3, in which the control circuitry comprises delay circuitry to delay the first voltage control signal to generate the input enable signal and to delay the second voltage control signal to generate the output enable signal.

5. A data buffer according to claim 3, in which the control circuitry is configured to generate the second voltage control signal in response to a detection of completion of a data input operation.

6. A data buffer according to claim 3, in which the control circuitry is configured to generate the first voltage control signal in response to a detection of completion of a data output operation.

7. A data buffer according to claim 1, in which the control circuitry is configured to inhibit changes to the operating voltage of the first data storage circuitry in response to the first and second operating voltages differing by less than a threshold difference.

8. A data buffer according to claim 1, in which the control circuitry is configured to control an operating voltage of the first input circuitry and the first output circuitry to be substantially the first operating voltage during a data input operation by the first input circuitry and to be substantially the second operating voltage during a data output operation by the first output circuitry.

9. A data buffer according to claim 1, comprising clamp circuitry to set a node of the first input circuitry to a first predetermined voltage during a period when the first input circuitry is not ready for data input operation and to set a node of the first output circuitry to a second predetermined voltage during a period when the first output circuitry is not ready for data output operation.

10. A data buffer according to claim 9, in which the clamp circuitry is configured to set the node of the first input circuitry to substantially the first predetermined voltage in response to a non-operational mode of external circuitry connected to the first input circuitry, and to set the node of the first output circuitry to substantially the second predetermined voltage in response to a non-operational mode of external circuitry connected to the first output circuitry.

11. A data buffer according to claim 1, in which the one or more power gating switches are configured to connect the first data storage circuitry to no more than one of the first and second power rails at any time.

12. A data buffer comprising:
   first means for storing data;
   first input means, in a first voltage domain, for inputting data to be stored by the first data storing means at a first operating voltage;
   first output means, in a second voltage domain different from the first voltage domain, for outputting stored data from the first data storing means at a second operating voltage different from the first operating voltage;
   control means for controlling an operating voltage of the first data storing means to be substantially the first operating voltage during a data input operation by the first input means and to be substantially the second operating voltage during a data output operation by the first output means,
   second means for storing data;
   second input means for inputting data to be stored by the second means for storing data; and
   second output means for outputting stored data from the second means for storing data,
   wherein:
   the second input means for inputting data is configured to input data at substantially the second operating voltage;
   the second means for outputting stored data is configured to output data at substantially the first operating voltage;
   the control means is configured to:
      control an operating voltage of the second means for storing data to be substantially the first operating voltage during a data output operation by the second means for outputting stored data and to be substantially the second operating voltage during a data input operation by the second input means for inputting data;
      control the operating voltages of the first means for storing data and the second means for storing data so that when one of the first means for storing data and the second means for storing data is operating according to the first operating voltage, the other of the first means for storing data and the second means for storing data is operating according to the second operating voltage;
      selectively connect power supply inputs of the first means for storing data and the second means for storing data together in response to initiation of a change of operating voltage of the means for storing data and the second means for storing data;
   the control means comprises one or more power gating switches to selectively connect the power supply inputs of the first means for storing data and the second means for storing data to first or second power rails corresponding to the first and second operating voltages respectively, and an interconnection switch configured to connect the power supply inputs of the first means for storing data and the second means for storing data together;
   the control means is configured, in response to initiation of a change in the operating voltages of the first means for storing data and the second means for storing data, to control the interconnection switch to temporarily connect the power supply inputs of the first means for storing data and the second means for storing data together, and then to control the one or more power gating switches to connect the power supply inputs of the first means for storing data and the second means for storing data to respective ones of the first and second power rails.

13. A method of operation of a data buffer comprising:
   inputting data, in a first voltage domain, to be stored at a first operating voltage;
   storing the data in first data storage circuitry;
   outputting stored data, in a second voltage domain different from the first voltage domain, at a second operating voltage different from the first operating voltage;
   controlling an operating voltage of the first data storage circuitry to be substantially the first operating voltage during the inputting step and to be substantially the second operating voltage during the outputting,
   inputting data at substantially the second operating voltage to be stored by a second data storage circuitry;
   outputting stored data at substantially the first operating voltage from the second data storage circuitry;
   controlling an operating voltage of the second data storage circuitry to be the substantially first operating voltage during a data output operation and to be substantially the second operating voltage during a data input operation;
   controlling the operating voltages of the first data storage circuitry and the second data storage circuitry so that when one of the data storage circuitry and the second data storage circuitry is operating according to the first operating voltage, the other of the first data storage circuitry and the second data storage circuitry is operating according to the second operating voltage;
   wherein the data buffer comprises one or more power gating switches to selectively connect the power supply inputs of the first data storage circuitry and the second data storage circuitry to first or second power rails corresponding to the first and second operating voltages respectively, and an interconnection switch configured to connect the power supply inputs of the first data storage circuitry and the second data storage circuitry together; and
   the method further comprises, in response to initiation of a change in the operating voltages of the first data storage circuitry and the second data storage circuitry, temporarily connecting the power supply inputs of the first data storage circuitry and the second data storage circuitry together, and then connecting the power supply inputs of the first data storage circuitry and the second data storage circuitry to respective ones of the first and second power rails.

* * * * *